(12) United States Patent
Jang et al.

(10) Patent No.: US 10,510,978 B2
(45) Date of Patent: Dec. 17, 2019

(54) LIGHT EMITTING ELEMENT USING CHARGE GENERATING LAYER FORMED THROUGH SOLUTION PROCESS AND METHOD FOR MANUFACTURING SAME

(71) Applicant: UNIVERSITY-INDUSTRY COOPERATION GROUP OF KYUNG HEE UNIVERSITY, Yongin-si, Gyeonggi-do (KR)

(72) Inventors: Jin Jang, Seoul (KR); Hyo Min Kim, Seoul (KR); Jeong Gi Kim, Seoul (KR)

(73) Assignee: UNIVERSITY-INDUSTRY COOPERATION GROUP OF KYUNG HEE UNIVERSITY, Yongin-si, Gyeonggi-Do (KR)

( * ) Notice: Subject to any disclaimer, the term of this patent is extended or adjusted under 35 U.S.C. 154(b) by 31 days.

(21) Appl. No.: 15/533,116

(22) PCT Filed: Dec. 3, 2015

(86) PCT No.: PCT/KR2015/013148
§ 371 (c)(1),
(2) Date: Jun. 5, 2017

(87) PCT Pub. No.: WO2016/089131
PCT Pub. Date: Jun. 9, 2016

(65) Prior Publication Data
US 2018/0261796 A1 Sep. 13, 2018

(30) Foreign Application Priority Data

Dec. 3, 2014 (KR) .................. 10-2014-0171827

(51) Int. Cl.
*H01L 29/08* (2006.01)
*H01L 51/52* (2006.01)
(Continued)

(52) U.S. Cl.
CPC .......... *H01L 51/5221* (2013.01); *C09K 11/06* (2013.01); *H01L 51/50* (2013.01);
(Continued)

(58) Field of Classification Search
CPC .................................................. H01L 51/5221
(Continued)

(56) References Cited

U.S. PATENT DOCUMENTS 8,728,848 B2 5/2014 Girotto
2005/0217722 A1* 10/2005 Komatsu ............... B82Y 10/00
                                                                 136/263
(Continued)

FOREIGN PATENT DOCUMENTS

CN       101587941 A     11/2009
KR    1020090020516 A     2/2009
(Continued)

OTHER PUBLICATIONS

Korean Notice of Allowance dated May 22, 2017 in connection with the counterpart Korean Patent Application No. 10-2014-0171827.
(Continued)

*Primary Examiner* — Ajay Arora
(74) *Attorney, Agent, or Firm* — Hauptman Ham, LLP

(57) ABSTRACT

The present invention provides a light emitting element using a charge generating layer formed through a solution process and a method for manufacturing the same. The present invention provides a light emitting element comprising a positive electrode, a negative electrode, a light emitting layer, and a charge generating layer, the light emitting element being characterized in that the charge generating layer has a p-type layer, which comprises an organic semiconductor, and an n-type layer, which comprises an oxide semiconductor, formed in a layer-by-layer structure through a solution process.

7 Claims, 29 Drawing Sheets

(51) Int. Cl.
  *C09K 11/06* (2006.01)
  *H01L 51/50* (2006.01)
  *H01L 51/56* (2006.01)
(52) U.S. Cl.
  CPC ...... *H01L 51/5056* (2013.01); *H01L 51/5072* (2013.01); *H01L 51/5088* (2013.01); *H01L 51/5206* (2013.01); *H01L 51/56* (2013.01)
(58) Field of Classification Search
  USPC .......................................................... 257/40
  See application file for complete search history.

(56) References Cited

U.S. PATENT DOCUMENTS

| | | | | |
|---|---|---|---|---|
| 2013/0009131 A1* | 1/2013 | Kazlas | .................... | B82Y 20/00 257/13 |
| 2015/0221895 A1* | 8/2015 | Sato | .................... | H01L 27/3211 257/40 |
| 2017/0125714 A1* | 5/2017 | Jung | .................... | H01L 51/504 |

FOREIGN PATENT DOCUMENTS

| | | | |
|---|---|---|---|
| KR | 1020090029675 A | 3/2009 | |
| KR | 1020110051427 A | 5/2011 | |
| KR | 1020130079230 A | 7/2013 | |
| KR | 101437271 B1 | 9/2014 | |
| KR | 1020150042950 A | 4/2015 | |
| WO | 2012075639 A1 | 6/2012 | |
| WO | WO-2018056578 A1 * | 3/2018 | ............. C09K 11/06 |

OTHER PUBLICATIONS

Korean Office Action dated Aug. 11, 2016 in connection with the counterpart Korean Patent Application No. 10-2014-0171827.
International Search Report for PCT/KR2015/013148 dated Mar. 9, 2016.

* cited by examiner

LIGHT EMITTING ELEMENT USING CHARGE GENERATING LAYER FORMED THROUGH SOLUTION PROCESS AND METHOD FOR MANUFACTURING SAME

CROSS REFERENCE TO RELATED APPLICATION

This present application is a national stage filing under 35 U.S.C. § 371 of PCT application number PCT/KR2015/013148 filed on Dec. 3, 2015 which is based upon and claims the benefit of priority to Korean Patent Application Nos. 10-2014-0171827 filed on Dec. 3, 2014 in the Korean Intellectual Property Office. The disclosures of the above-listed applications are hereby incorporated by reference herein in their entirety.

BACKGROUND

1. Technical Field

The present invention relates to a light-emitting element using a charge-generating layer formed through a solution process and to a method for manufacturing the same.

2. Description of the Related Art

Recent development efforts are focusing on the manufacture of high-performance organic and quantum dot light-emitting diodes. In this context, the generating and transport of electrons are of critical importance.

Examples of representative electron transport layers may include low-molecular layers such as TPBi, Bphen, TmPyPb, etc., for organic light-emitting diodes, and may include oxide layers for quantum dot light emitting diodes, but in such layers, the injection and movement of electrons may be limited.

Generally, in the case of an organic light-emitting diode, a frequently used technique involves using a layer-by-layer configuration of NPD or TCTA and HAT-CN, which can only be applied by vacuum deposition processes, as the combination for the charge-generating layer so as to reduce the energy barrier to the next transport layer and rearranging. Such result based on inserting a charge-generating layer can only be implemented by vacuum deposition.

When using such a charge-generating layer combination based on vacuum deposition processes, ultra-vacuum equipment is inevitably needed.

Vacuum deposition processes entail the drawback that the substrate is subject to bending when performing large-area processes, and the charge-generating layer implemented with this method requires a full hour due to procedures such as preheating, deposition, cooling, and the like. As such, there is a need for an alternative method that can offer the properties of a charge-generating layer while allowing large-area processes and low-temperature processes.

SUMMARY OF THE INVENTION

To resolve the problems described above, an aspect of the present invention aims to provide a light-emitting element that uses a charge-generating layer formed through a solution process, as well as a method of manufacturing the light-emitting element, which can reduce process times and is not limited in terms of the semiconductor properties of the substrate.

The present invention was conceived to resolve the problems found in the related art as described above, and one embodiment of the invention provides a light-emitting element that includes an anode, a cathode, a light-emitting layer, and a charge-generating layer, where the charge-generating layer comprises a p-type layer of an organic semiconductor and an n-type layer of an oxide semiconductor that are formed by way of a solution process in a layer-by-layer structure.

The organic semiconductor can include at least one of PEDOT:PSS and a mixture of the PEDOT:PSS and an additive.

The additive can include at least one of tungsten oxide, graphene oxide (GO), CNT, molybdenum oxide ($MoO_x$), vanadium oxide ($V_2O_5$), and nickel oxide ($NiO_x$).

The additive can be added in a proportion of 5 to 50 volume percent to the PEDOT:PSS.

The oxide semiconductor can include at least one of zinc oxide (ZnO) or the zinc oxide doped with Al, Li, Cs, Ca, and Mg.

The content of the dopant with which the zinc oxide is doped can be 0.1 to 30 atomic percent with respect to the zinc oxide.

The thickness ratio of the p-type layer and the n-type layer can be 1:0.5 to 1:2.

The light-emitting layer can be of a low-molecular organic substance.

The light-emitting layer can be of an inorganic substance having quantum dots.

Another aspect of the invention provides a method for manufacturing an organic light-emitting diode. The method includes: forming an anode over a substrate; forming a charge-generating layer over the anode by way of a solution process, with the charge-generating layer including an n-type layer and a p-type layer stacked sequentially in a layer-by-layer structure; forming a light-emitting layer over the charge-generating layer, with the light-emitting layer including a low-molecular organic substance; forming an electron transport layer over the light-emitting layer; and forming a cathode over the electron transport layer, where the n-type layer comprises an oxide semiconductor, and the p-type layer comprises an organic semiconductor.

Still another aspect of the invention provides a method for manufacturing a quantum dot light-emitting diode. The method includes: forming a cathode over a substrate; forming a charge-generating layer over the cathode by way of a solution process, with the charge-generating layer including a p-type layer and an n-type layer stacked sequentially in a layer-by-layer structure; forming a light-emitting layer over the charge-generating layer, with the light-emitting layer comprising an inorganic substance having quantum dots; forming a hole transport layer over the light-emitting layer; and forming an anode over the hole transport layer, where the p-type layer includes an organic semiconductor, and the n-type layer comprises an oxide semiconductor.

According to an embodiment of the present invention, the manufacture can be performed via solution processes such that the p-type layer of the charge-generating layer is made from an organic semiconductor and the n-type layer is made from an oxide semiconductor. This can reduce the manufacture process times, and the organic light-emitting diode thus emitted can remain unaffected by differences in the work function of the substrate.

Also, according to an embodiment of the present invention, LZO and PEDOT:PSS, with which solution processes are possible, can be formed in a layer-by-layer configuration, and the stable charge generation and injection as well as facilitated movement enable the manufacture of high-performance organic and quantum dot light-emitting diodes.

Additional aspects and advantages of the present invention will be set forth in part in the description which follows,

DETAILED DESCRIPTION OF THE INVENTION

First, definitions of some of the terms used in this specification are provided below.

A solution process encompasses all existing processes that use a liquid solvent for forming a film, such as spin coating, spray coating, deep coating, inkjet printing, roll-to-roll printing, screen printing, etc.

A vacuum deposition process refers to a process in which deposition is performed while under a negative pressure and encompasses all existing processes such as CVD (chemical vapor deposition) methods, sputtering, which is a type of PVD (physical vapor deposition) method, and the like.

The present invention relates to forming the charge-generating layer, which is for transferring charges (electrons and holes) in a light-emitting diode that includes a light-emitting layer, by way of solution processes, with p-type organic semiconductors and n-type oxide semiconductors formed in a layer-by-layer configuration.

Light-emitting elements according to an embodiment of the present invention can include organic light-emitting diodes, in which the light-emitting layer is an organic substance, and quantum dot light-emitting diodes, in which the light-emitting layer is an inorganic substance.

A detailed description of certain embodiments of the present invention is provided below with reference to the drawings. However, it should be appreciated that the drawings are provided merely for the sake of greater ease in explaining the present invention and that the scope of the present invention is not to be limited by the scope of the drawings.

Figure 1:
FIG. 1 is a cross-sectional structure diagram of an organic light-emitting diode according to an embodiment of the present invention.

FIG. 1 is a cross-sectional structure diagram of an organic light-emitting diode according to an embodiment of the present invention.

As illustrated in FIG. 1, an organic light-emitting diode according to an embodiment of the present invention can include an anode 1, a cathode 2, a charge-generating layer 3, a hole injection/transport layer 4, a light-emitting layer 5, and an electron injection/transport layer 6.

The anode 1 and cathode 2 can be formed by a well known vacuum deposition (CVD) process or by a method of printing a metal paste or ink in which metal flakes or particles are mixed with a binder, etc.; the method of forming the anode or the cathode is not limited to a particular method.

The anode 1, which is the electrode that provides holes to the element, can be formed by a solution process such as by screen printing a metal paste or a metal ink substance in which metal particles are in a colloidal state within a particular liquid. Here, the metal paste can be any one of silver (Ag) paste, aluminum (Al) paste, gold (Au) paste, copper (Cu) paste, etc., or an alloyed form. Also, the metal ink substance can include at least one of silver (Ag) ink, aluminum (Al) ink, gold (Au) ink, calcium (Ca) ink, magnesium (Mg) ink, lithium (Li) ink, and cesium (Cs) ink. The metal substance included in a metal ink substance may be in an ionized state in the solution.

The cathode 2 can be deposited in a high vacuum state by way of a vacuum deposition process or can be formed by a solution or paste process with a metal substance conventionally used for forming cathodes. The material for forming the cathode is not limited to a particular material, and existing materials for forming cathodes can be used without limit. Some examples of existing materials for forming cathodes may include aluminum (Al), calcium (Ca), barium (Ba), magnesium (Mg), lithium (Li), cesium (Cs), etc., which are metals that are readily oxidized.

Also, some non-limiting examples of transparent metal oxides from which the cathode can be formed may include ITO (indium tin oxide), FTO (fluorine-doped tin oxide), ATO (antimony tin oxide), AZO (aluminum-doped zinc oxide), etc. In the case of a transparent metal oxide electrode, a process such as sol-gel, spray pyrolysis, sputtering, ALD (atomic layer deposition), e-beam evaporation, etc., can be applied.

The anode 1 or the cathode 2 can be formed over a substrate.

For the substrate, a glass substrate, a plastic substrate that includes any one plastic of PET (polyethylene terephthalate), PEN (polyethylene naphthalate), PP (polypropylene). PI (polyamide), TAC (triacetyl cellulose), PES (polyethersulfone), etc., a flexible substrate that includes any one of aluminum foil, stainless steel foil, etc., can be used.

The hole injection/transport layer 4, which is the layer that moves holes to the light-emitting layer 5, can be formed using an organic material or an inorganic material via a vacuum deposition process or a solution process.

In the hole injection/transport layer 4, the layer for transporting holes can be formed from PEDOT:PSS, where a mixture of PEDOT:PSS and an additive such as tungsten oxide, graphene oxide (GO), CNT, molybdenum oxide ($MoO_x$), vanadium oxide ($V_2O_5$), and nickel oxide ($NiO_x$) can also be used. Of course, the material is not limited to the above, and various organic or inorganic materials can be used.

While the hole injection/transport layer 4 is described above as a single layer, this is merely for the sake of convenience, and implementations in which a hole injection layer and a hole transport layer are provided as separate layers are also encompassed within the scope of the present invention.

Furthermore, with the addition of the charge-generating layer, it is also possible to provide a light-emitting element in which a hole injection/transport layer is omitted.

Also, according to a preferred embodiment of the present invention, it is possible to include only a hole transport layer in the element without a hole injection layer.

The light-emitting layer 5 may include an organic material, preferably a low-molecular organic compound, and may generate light via a photoemission effect of the organic substance.

A light-emitting layer 5 according to this embodiment can use, but is not limited to, the low-molecular substance CBP(N'-dicarbazole-biphenyl) as the host and the low-molecular substance Ir(ppy)3 as the dopant.

The electron injection/transport layer 6, which is a layer that is added for moving the electrons generated at the cathode 2 to the light-emitting layer 5 to increase the efficiency of the element, may be formed between the cathode 2 and the light-emitting layer 5.

Preferably, the electron injection/transport layer 6 can be made of an organic substance.

While the electron injection/transport layer 6 is described above as a single layer, this is merely for the sake of convenience, and implementations in which an electron injection layer and an electron transport layer are provided as separate layers are also encompassed within the scope of the present invention.

According to a preferred embodiment of the present invention, a charge-generating layer 3 formed by a solution process may be added between the anode 1 and the hole injection/transport layer 4 described above.

As described above, a solution process refers to a process that uses a liquid solvent to form a film, such as spin coating, spray coating, deep coating, inkjet printing, roll-to-roll printing, screen printing, etc.

A charge-generating layer 3 according to this embodiment may have an n-p junction structure with a p-type layer formed from an organic semiconductor and an n-type layer formed from an oxide semiconductor, and may be formed in a layer-by-layer structure by way of solution processes.

Preferably, the organic semiconductor for the p-type layer can include PEDOT:PSS or a mixture of tungsten oxide, graphene oxide (GO), CNT, molybdenum oxide ($MoO_x$), vanadium oxide ($V_2O_5$), or nickel oxide ($NiO_x$) added to the PEDOT:PSS.

The oxide semiconductor for the n-type layer can be include the inorganic semiconductor zinc oxide (ZnO) or a material having zinc oxide doped with Al, Li, Cs, Ca, and Mg.

Preferably, zinc oxide (AZO or LZO) doped with a metal such as aluminum or lithium can be used. However, the material is not limited to the above and any inorganic semiconductor capable of emitting electrons can be encompassed without limit within the scope of the present invention.

Here, the doping concentration of the metal can be within a range of 0.1 to 30 atomic percent with respect to the zinc oxide, and in the case of an organic light-emitting diode, the preferred doping concentration can be 10 to 20 atomic percent.

At least one of tungsten oxide ($WO_x$), graphene oxide (GO), CNT, molybdenum oxide ($MoO_x$), vanadium oxide ($V_2O_5$), and nickel oxide ($NiO_x$) can be added to the PEDOT:PSS in a proportion of 5 to 50 volume percent, preferably 10 to 15 volume percent.

Generating charge using such a charge-generating layer 3 can provide high field effect mobility, making it possible to implement a high-performance light-emitting element.

Also, according to a preferred embodiment of the present invention, the thicknesses of the p-type layer and the n-type layer can each be 0.1 to 50 nm, preferably with a ratio of 1:0.5 to 1:2 between the thicknesses of the p-type layer and the n-type layer, and most preferably with the ratio at 1:1.5.

A method for manufacturing an organic light-emitting diode according to this embodiment may include:

forming an anode over a substrate;

forming a charge-generating layer over the anode by way of a solution process, with the charge-generating layer including an n-type layer and a p-type layer stacked sequentially in a layer-by-layer structure:

forming a light-emitting layer over the charge-generating layer, with the light-emitting layer including a low-molecular organic substance:

forming an electron injection/transport layer over the light-emitting layer; and forming a cathode over the electron injection/transport layer, where the n-type layer comprises an oxide semiconductor, and the p-type layer comprises an organic semiconductor.

Figure 2:
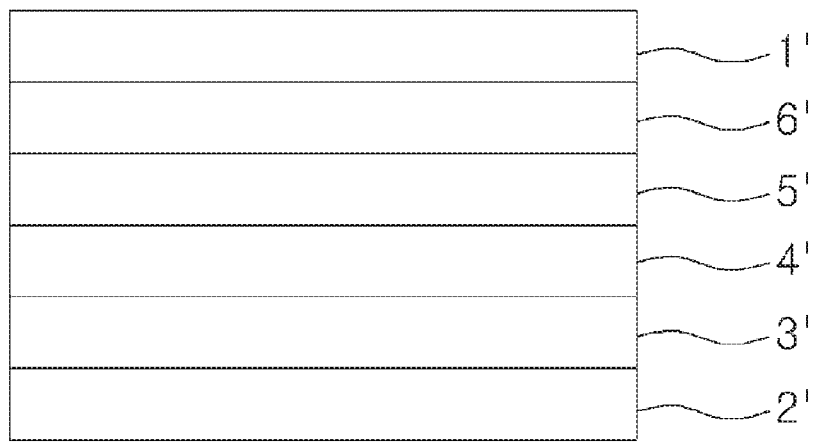
FIG. 2 is a cross-sectional structure diagram of a quantum dot light-emitting diode according to an embodiment of the present invention.
Figure 3A:
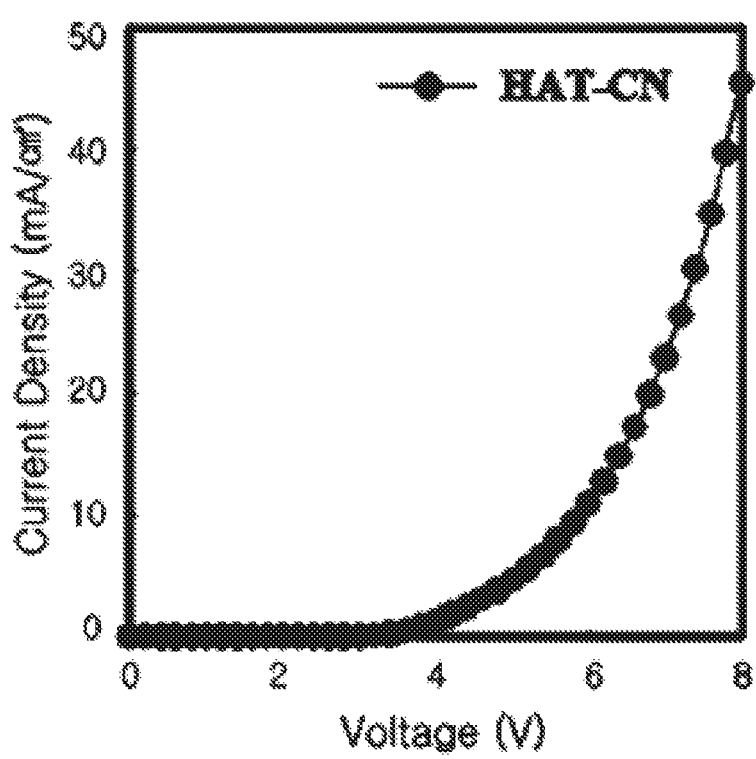
FIG. 3A to FIG. 3D represent the properties of an OLED that uses a HAT-CN(1,4,5,8,9,11-hexaazatriphenylene-hexacarbonitrile)/NPD junction obtained via a vacuum deposition process as the charge-generating layer.
Figure 3B:
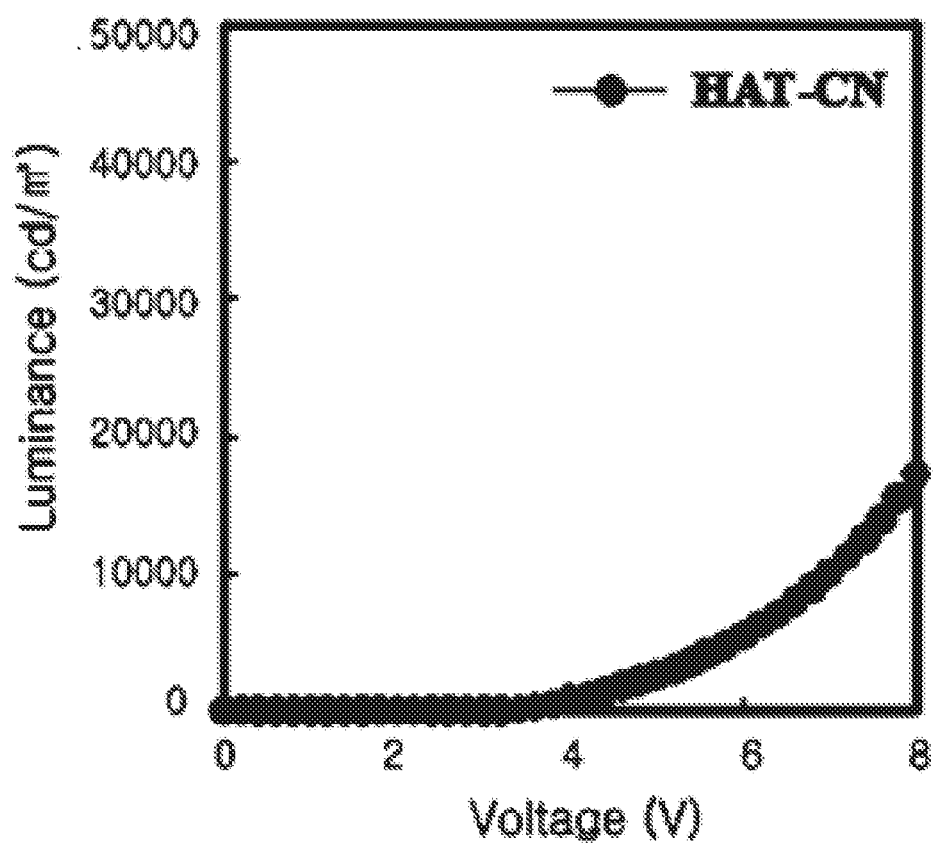
Figure 3C:
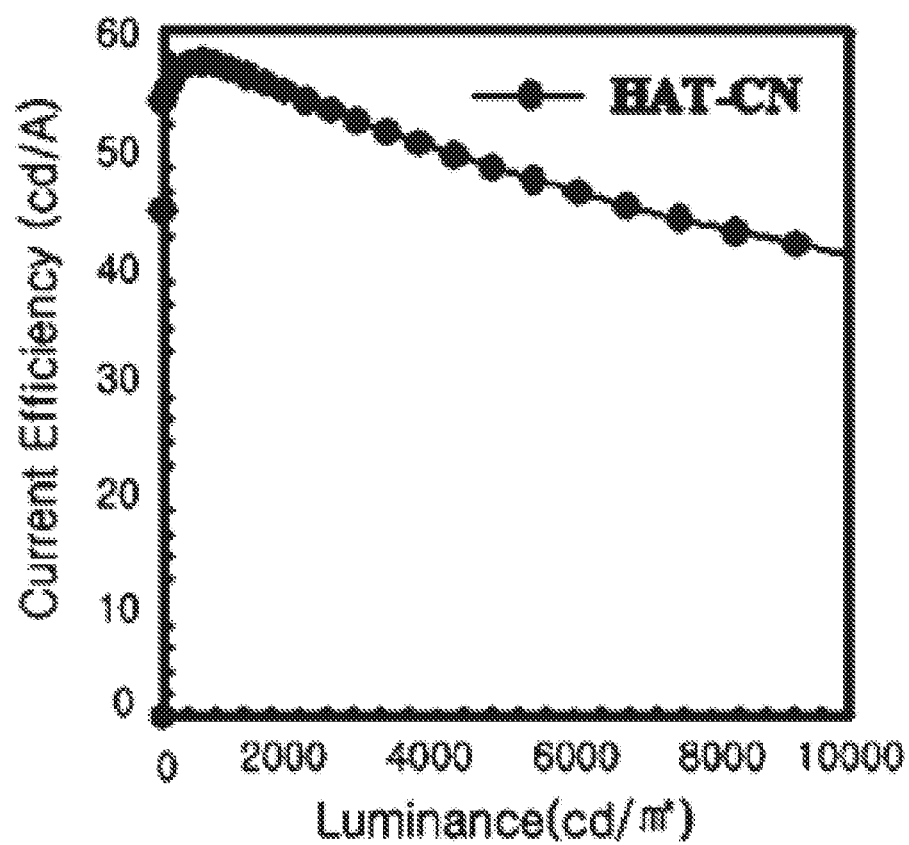
Figure 3D:
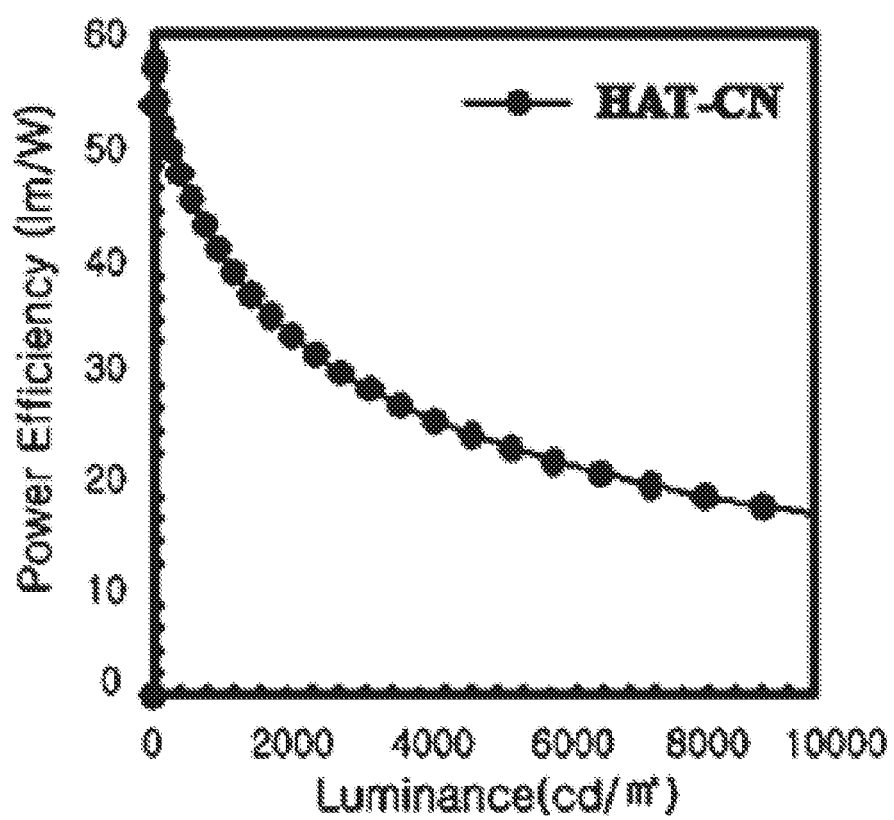
Figure 4A:
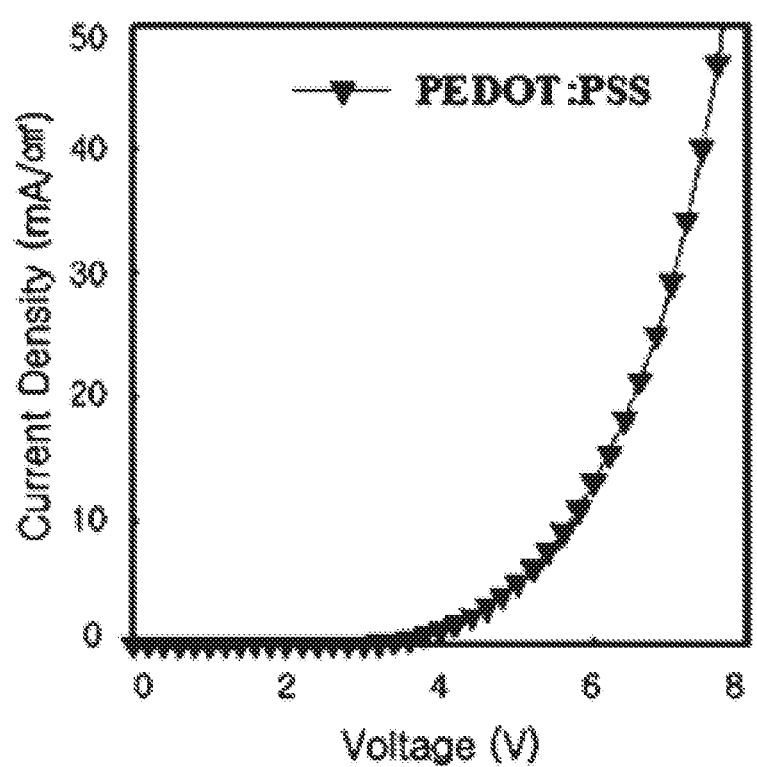
FIG. 4A to FIG. 4D represent the properties of an OLED that uses PEDOT:PSS based on a solution process as the hole injection/transport layer.
Figure 4B:
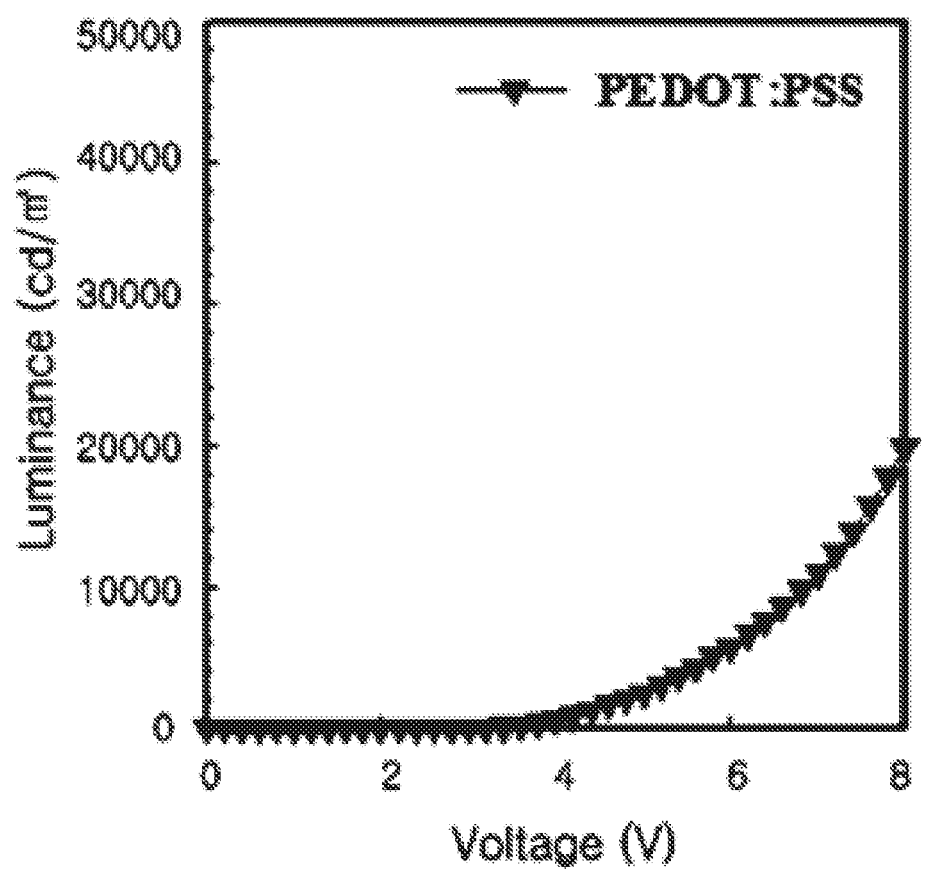
Figure 4C:
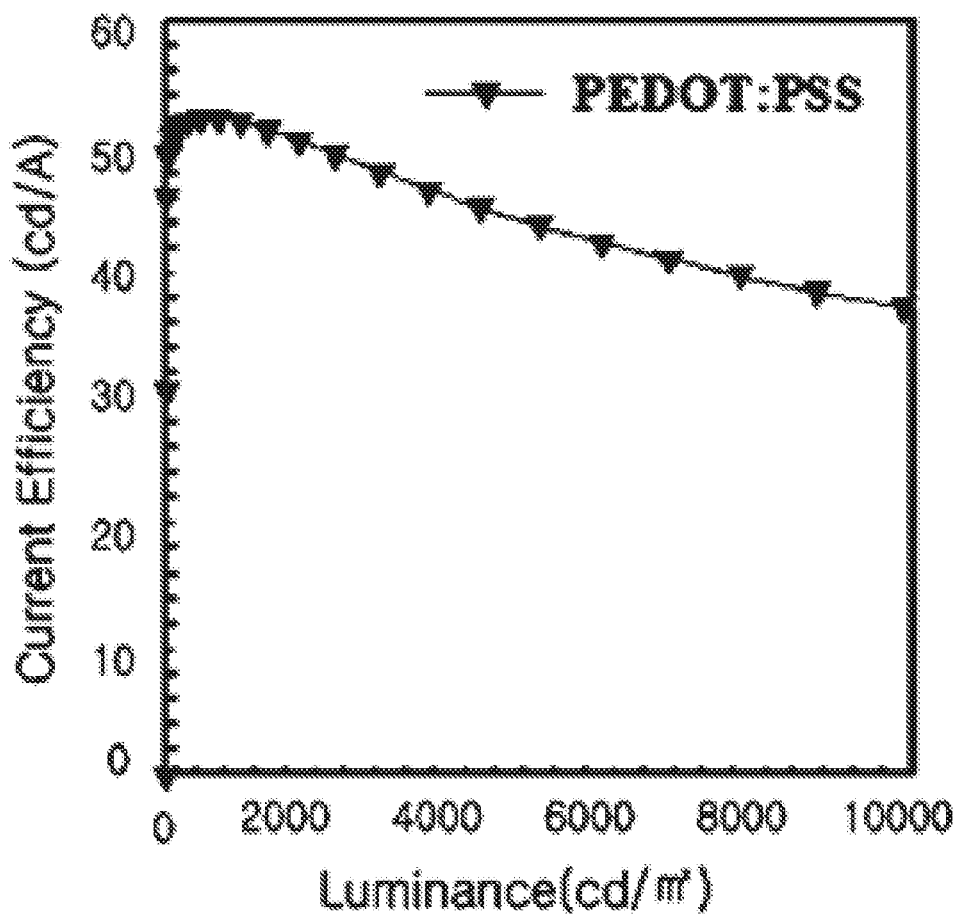
Figure 4D:
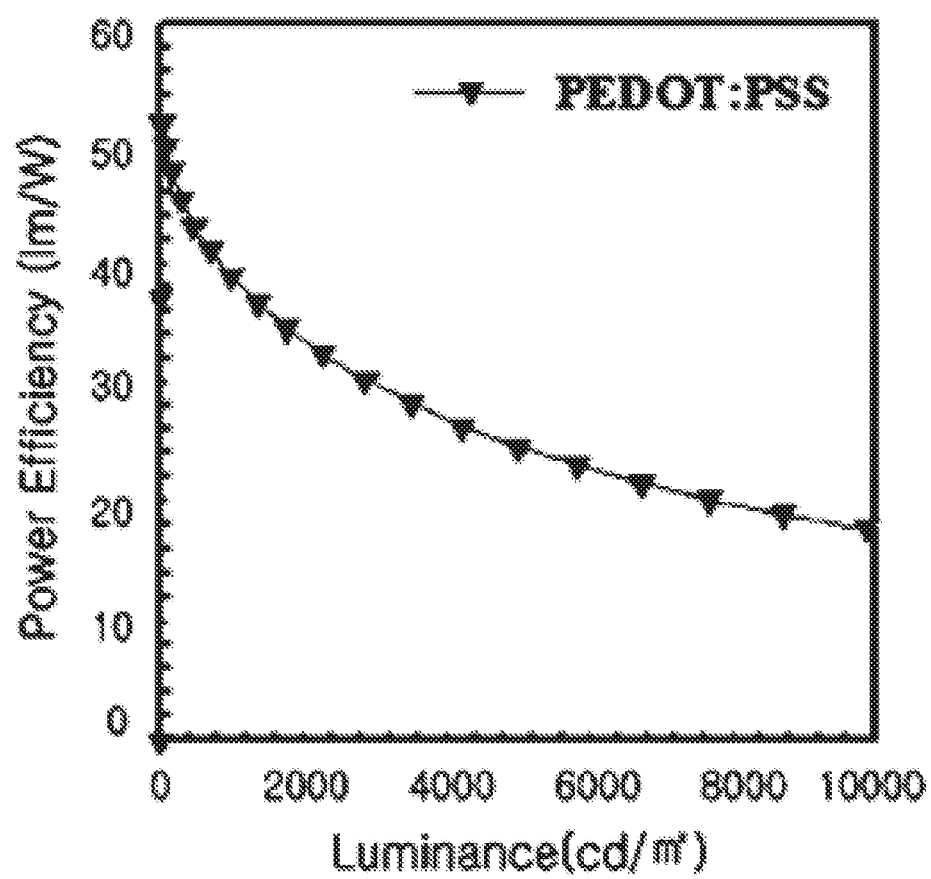
Figure 5A:
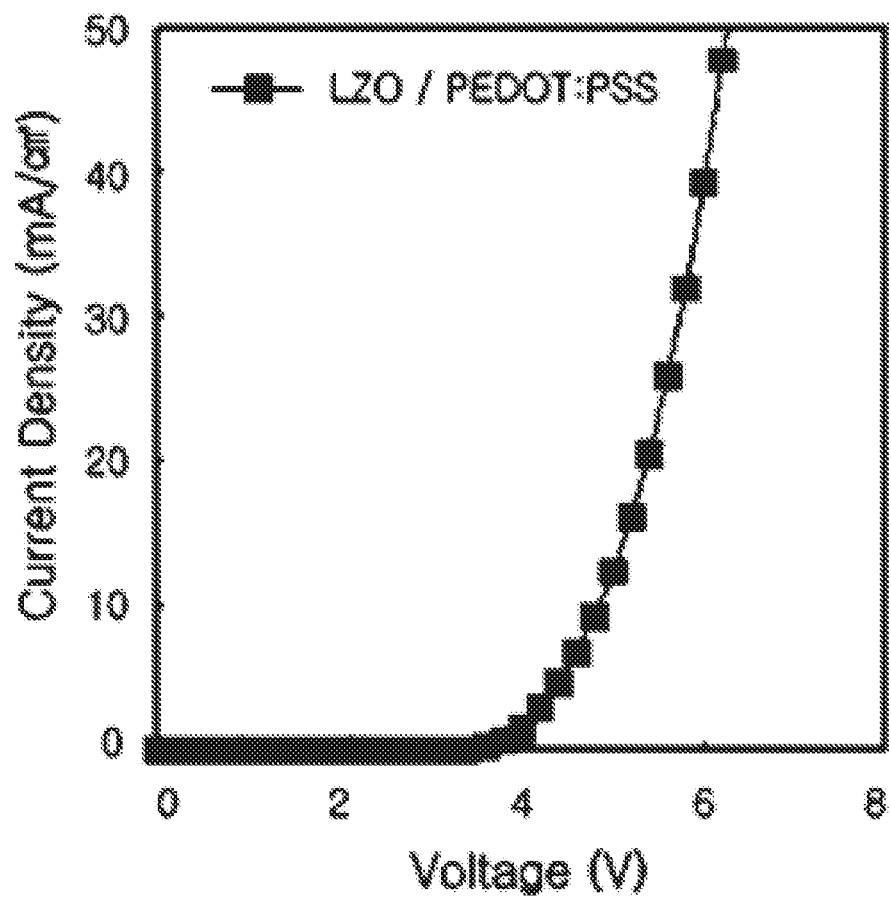
FIG. 5A to FIG. 5D represent the properties of an OLED that uses 20 atomic % LZO and PEDOT:PSS based on a solution process as the charge-generating layer.
Figure 5B:
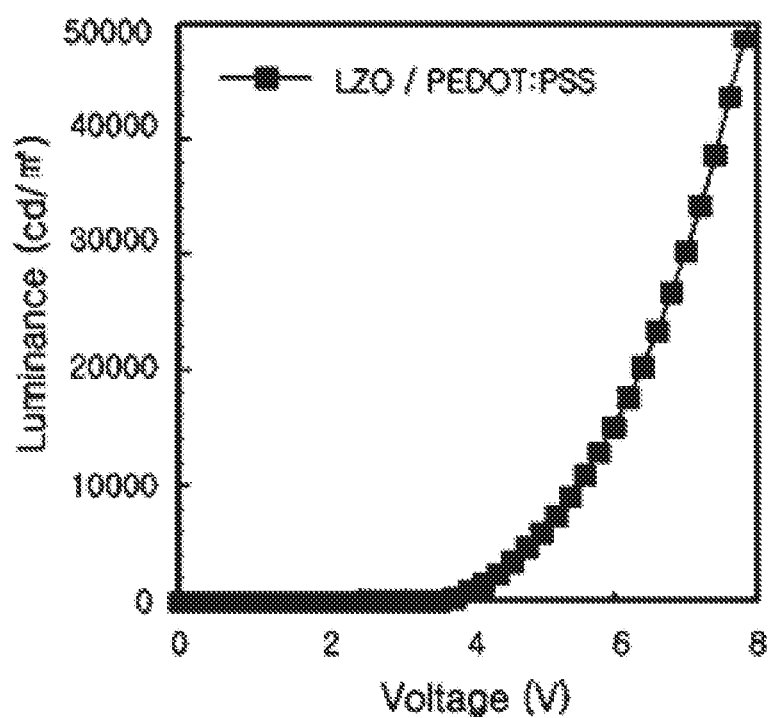
Figure 5C:
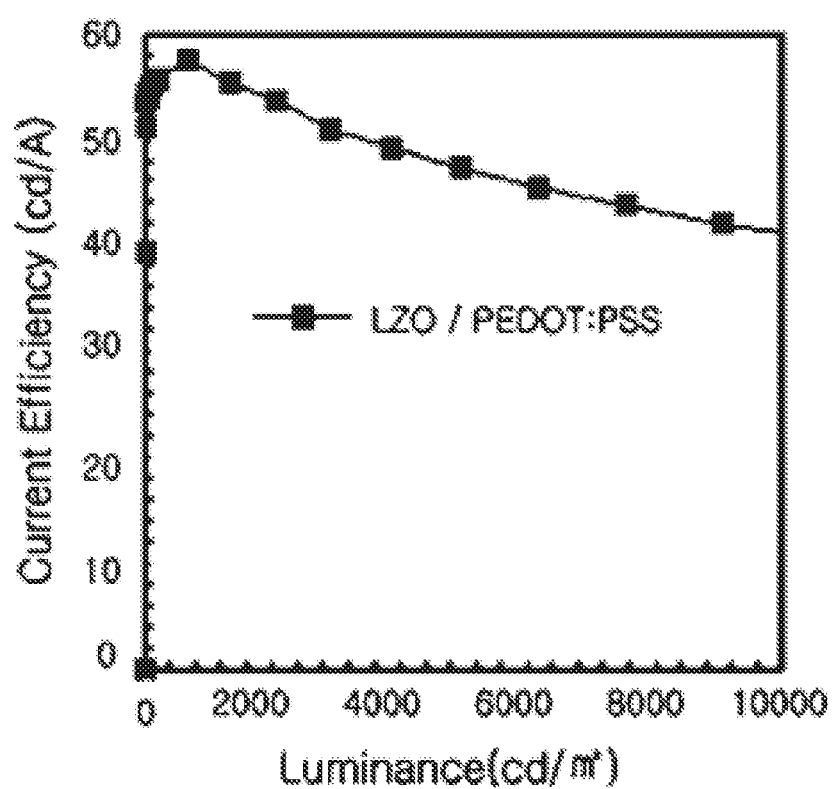
Figure 5D:
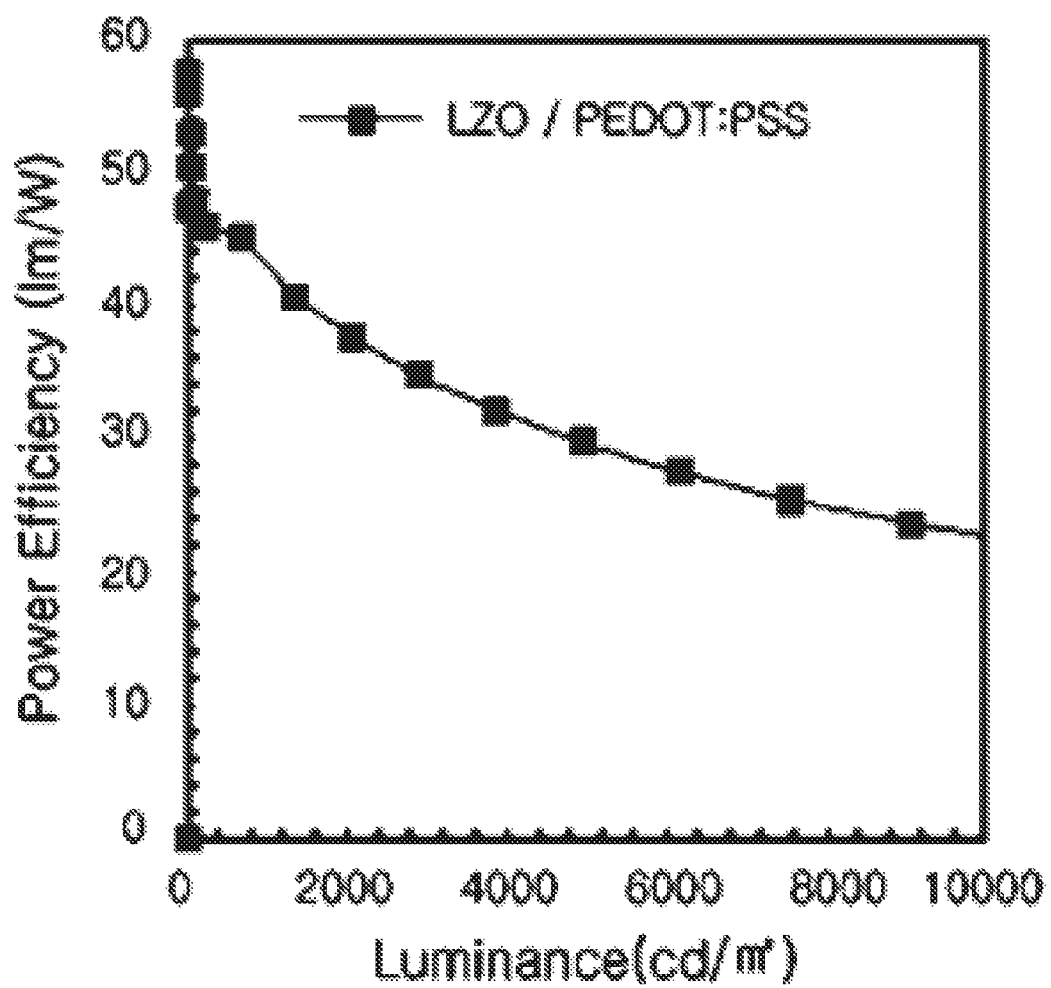

FIG. 2 is a cross-sectional structure diagram of a quantum dot light-emitting diode according to an embodiment of the present invention.

As illustrated in FIG. 2, a quantum dot light-emitting diode according to an embodiment of the present invention can include an anode 1', a cathode 2', a charge-generating layer 3', an electron injection/transport layer 4', a light-emitting layer 5', and a hole injection/transport layer 6'.

Unlike the organic light-emitting diode, the quantum dot light-emitting diode illustrated in FIG. 2 may have the charge-generating layer 3' formed between the cathode 2' and the electron injection/transport layer 4'.

In the quantum dot light-emitting diode, the functions of and materials for the anode 1', cathode 2', electron injection/transport layer 4', and hole injection/transport layer 6' are the same as described above for the organic light-emitting diode, and as such redundant descriptions are omitted.

In the quantum dot light-emitting diode, the light-emitting layer 5' can be formed with quantum dots having cadmium selenide (CdSe) in the core and cadmium sulfide (CdS), zinc sulfide (ZnS) in the shell. Here, the light-emitting layer 5' can be formed by a solution process.

In the quantum dot light-emitting diode as well, the charge-generating layer 3' can have a p-n junction structure with a p-type layer formed from an organic semiconductor and an n-type layer formed from an oxide semiconductor, formed by a solution process into a layer-by-layer structure.

Preferably, the p-type layer can include PEDOT:PSS or a mixture of tungsten oxide, graphene oxide (GO), CNT, molybdenum oxide (MoO$_x$), vanadium oxide (V$_2$O$_5$), nickel oxide (NiO$_x$) added to the PEDOT:PSS, while the n-type layer can include the inorganic semiconductor zinc oxide (ZnO) or include a material having the zinc oxide doped with Al, Li, Cs, Ca, and Mg, preferably zinc oxide (AZO or LZO) doped with a metal such as aluminum or lithium. However, the material is not limited to the above and any inorganic semiconductor capable of emitting electrons can be encompassed without limit within the scope of the present invention.

Here, the doping concentration of the metal can be within a range of 0.1 to 30 atomic percent with respect to the zinc oxide, and in the case of a quantum dot light-emitting diode, the preferred doping concentration can be 0.1 to 5 atomic percent.

At least one of tungsten oxide (WO$_x$), graphene oxide (GO), CNT, molybdenum oxide (MoO$_x$), vanadium oxide (V$_2$O$_5$), and nickel oxide (NiO$_x$) can be added to the PEDOT:PSS in a proportion of 5 to 50 volume percent, preferably 10 to 15 volume percent.

Also, according to a preferred embodiment of the present invention, the thicknesses of the p-type layer and the n-type layer in the quantum dot light-emitting diode can each be 0.1 to 50 nm, preferably with a ratio of 1:0.5 to 1:2 between the thicknesses of the p-type layer and the n-type layer, and most preferably with the ratio at 1:1.5.

While the electron injection/transport layer 4' and the hole injection/transport layer 6' are each described above as a single layer, this is merely for the sake of convenience, and implementations in which an injection layer and a transport layer are provided as separate layers are also encompassed within the scope of the present invention.

Furthermore, with the addition of the charge-generating layer over the cathode, it is also possible to provide a quantum dot light-emitting element in which an electron injection/transport layer is omitted.

Also, according to a preferred embodiment of the present invention, it is possible to include only a hole transport layer in the element without a hole injection layer.

A method for manufacturing a quantum dot light-emitting diode according to this embodiment may include:

forming a cathode over a substrate:

forming a charge-generating layer over the cathode by way of a solution process, with the charge-generating layer including a p-type layer and an n-type layer stacked sequentially in a layer-by-layer structure;

forming a light-emitting layer over the charge-generating layer, with the light-emitting layer comprising an inorganic substance having quantum dots;

forming a hole transport layer over the light-emitting layer; and forming an anode over the hole transport layer, where the p-type layer includes an organic semiconductor, and the n-type layer comprises an oxide semiconductor.

A more detailed description of the present invention is provided below using specific examples. The examples below are merely for describing the present invention and are not intended to limit the scope of rights.

FIRST EXAMPLE

An organic light-emitting diode was prepared with the charge-generating layer formed as a layer-by-layer type with 20 atomic % LZO and PEDOT:PSS.

The LZO having zinc oxide doped with 20 atomic % of Li used ethanol as the solvent, while the PEDOT:PSS used water as the solvent.

The prepared solutions were printed over the anode by way of a solution process under a nitrogen or air atmosphere.

Afterwards, a hole transport layer, a light-emitting layer, an electron injection/transport layer, and a cathode were formed sequentially.

In the case of the organic light-emitting diode, 4,4'-bis [N-(naphthyl)-N-phenylamino]biphenyl (NPB) was used for the hole transport layer, 4,4'-bis(carbazol-9-yl)-biphenyl (CBP) and tris(2-phenylpyridine) iridium (Ir(ppy)3) were used for the light-emitting layer, 1,3,5-Tris(N-phenylbenzimidazol-2-yl) benzene (TPBi) was used for the electron transport layer, lithium fluoride (LiF) was used for the electron injection layer, and aluminum was used for the cathode.

A description is provided below, with reference to the drawings, of the properties of the organic light-emitting diode manufactured by the procedures described above.

FIG. 3A to FIG. 3D represent the properties of an OLED that uses a HAT-CN(1,4,5,8,9,11-hexaazatriphenylene-hexacarbonitrile)/NPD junction obtained via a vacuum deposition process as the charge-generating layer, FIG. 4A to FIG. 4D represent the properties of an OLED that uses PEDOT:PSS based on a solution process as the hole injection-transport layer, and FIG. 5A to FIG. 5D represent the properties of an OLED that uses 20 atomic % LZO and PEDOT:PSS based on a solution process as the charge-generating layer.

In each of FIG. 3A to FIG. 3D through FIG. 5A to FIG. 5D, graph (a) represents current density-voltage (J-V) characteristics, graph (b) represents luminance-voltage (L-V) characteristics, graph (c) represents current efficiency-luminance (C/E-L) characteristics, and graph (d) represents power efficiency-luminance (P/E-L) characteristics.

Also, Table 1 below lists the detailed properties of the OLED represented in each of FIG. 3A to FIG. 3D through FIG. 5A to FIG. 5D.

TABLE 1

| | | | Maximum | | At 1,000 cd/m$^2$ | | At 10,000 cd/m$^2$ | |
|---|---|---|---|---|---|---|---|---|
| HILs | V$_T$ (V) | V$_D$ (V) | C/E (cd/A) | P/E (lm/W) | C/E (cd/A) | P/E (lm/W) | C/E (cd/A) | P/E (lm/W) |
| HAT-CN | 2.67 | 4.13 | 57.33 | 57.50 | 59.07 | 44.93 | 44.16 | 19.87 |
| PEDOT:PSS | 2.66 | 4.25 | 56.59 | 56.50 | 55.87 | 41.30 | 38.72 | 17.78 |
| 20% LZO/PEDOT:PSS | 2.67 | 4.02 | 58.08 | 59.64 | 58.23 | 44.78 | 44.62 | 24.44 |

Referring to FIG. 3A to FIG. 3D and Table 1, it can be seen that the OLED using vacuum deposition-based HAT-CN/NPD as the charge-generating layer has a current density of 4.65 mA/cm$^2$ at around 5 V and a brightness of 17,000 cd/m$^2$ at around 8 V. Also, at a brightness of 1,000 cd/m², the current efficiency is 59.1 cd/A, and the power efficiency is 44.9 lm/W.

FIG. 4A to FIG. 4D represent the properties of an OLED that uses solution process-based PEDOT:PSS as the hole injection layer, illustrating a case in which there is no charge-generating layer formed.

Referring to FIG. 4A to FIG. 4D and Table 1, it can be seen that the OLED has a current density of 4.88 mA/cm² at around 5 V and a brightness of 20,000 cd/m² at around 8 V. Also, at a brightness of 1,000 cd/m², the current efficiency is 55.9 cd/A, and the power efficiency is 41.3 lm/W.

Referring to FIG. 5A to FIG. 5D and Table 1, it can be seen that the organic light-emitting diode having a charge-generating layer formed with zinc oxide doped with Li at 20 atomic % as the n-type layer and the organic semiconductor PEDOT:PSS as the p-type layer has a current density of 12.44 mA/cm² at around 5 V and a brightness of 54,000 cd/m² at around 8 V. Also, at a brightness of 1,000 cd/m², the current efficiency is 58.2 cd/A, and the power efficiency is 44.8 lm/W.

Figure 6:
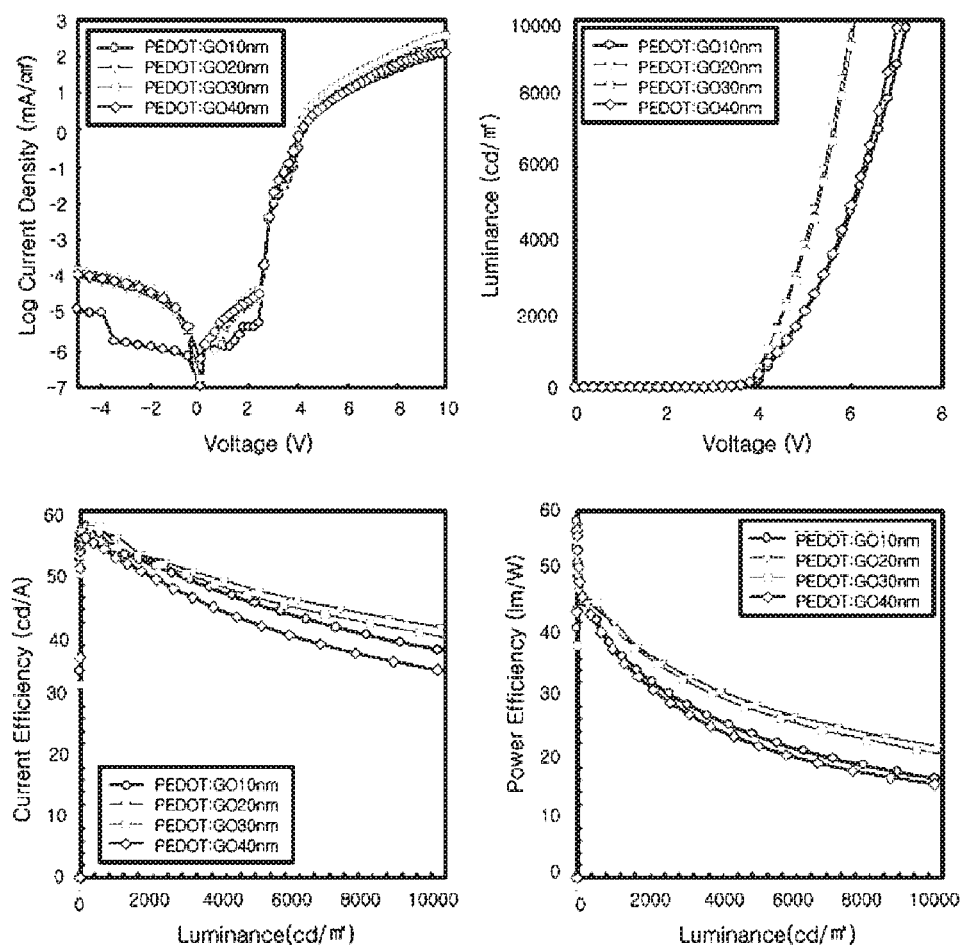
FIG. 6 and FIG. 7 represent the properties of OLED's according to an embodiment of the present invention for different thicknesses of LZO and PEDOT:PSS.
Figure 7:
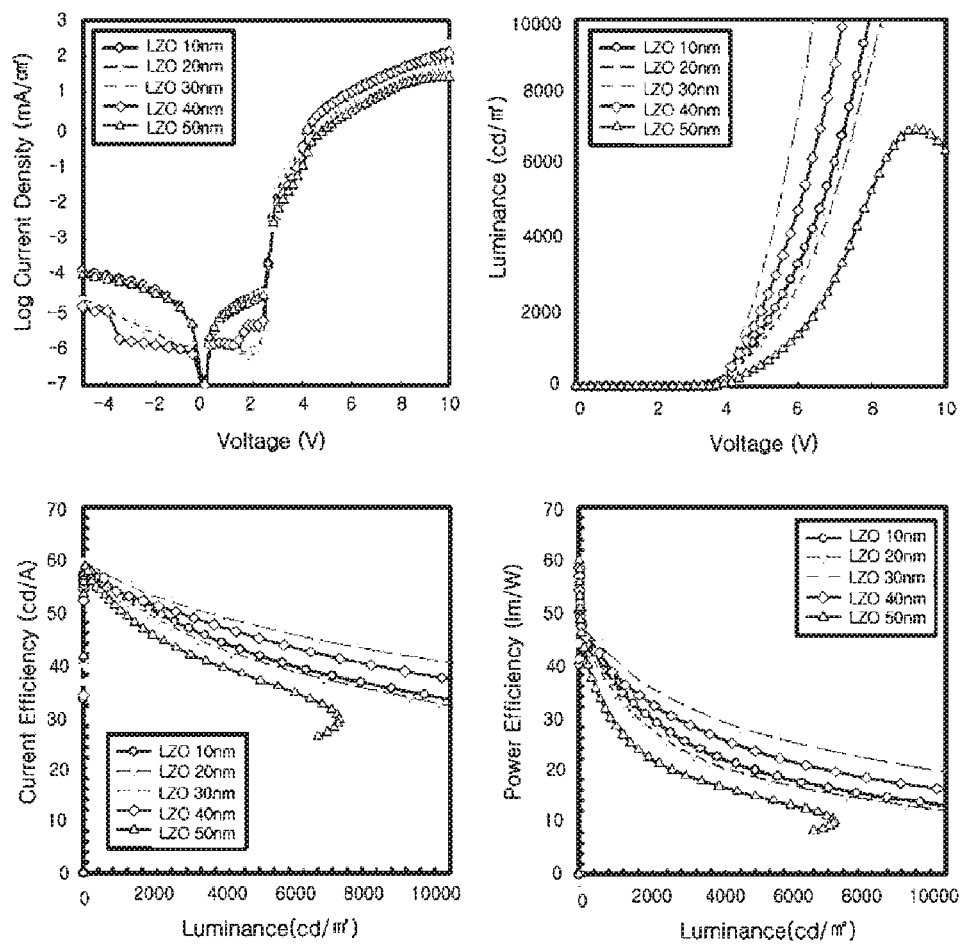

FIG. 6 and FIG. 7 represent the properties of OLED's according to an embodiment of the present invention for different thicknesses of LZO and PEDOT:PSS.

In FIG. 6 and FIG. 7, the p-type layer for the charge-generating layer according to this embodiment was formed by way of a solution process with graphene oxide (GO) mixed into PEDOT:PSS.

FIG. 6 shows results with the thickness of the LZO fixed and the thickness of the PEDOT:PSS varied, where the properties of the element are shown for different thicknesses of the PEDOT:PSS while the thickness of the LZO is fixed at 35 nm.

Referring to FIG. 6, it can be observed that, with the LZO fixed, the most desirable properties are obtained when the PEDOT:PSS is at 20 nm.

Also, FIG. 7 shows the properties of the element for different thicknesses of the LZO while the thickness of the PEDOT:PSS is fixed at 20 nm.

Referring to FIG. 7, it can be observed that, with the PEDOT:PSS at 20 nm, the most desirable properties are obtained when the LZO is at 10 to 30 nm, most preferably at 30 nm.

Figure 8:
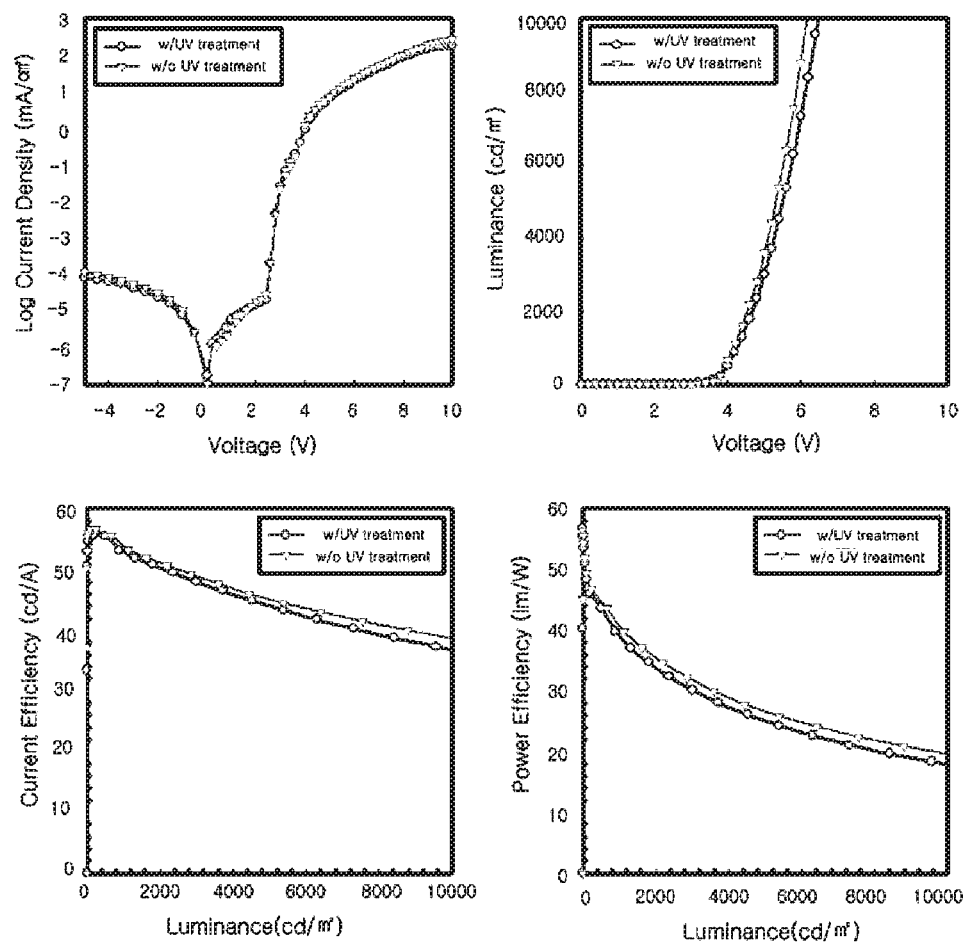
FIG. 8 shows graphs which illustrate that the work function of the substrate remains unaffected when a charge-generating layer according to an embodiment of the present invention is applied.
Figure 9A:
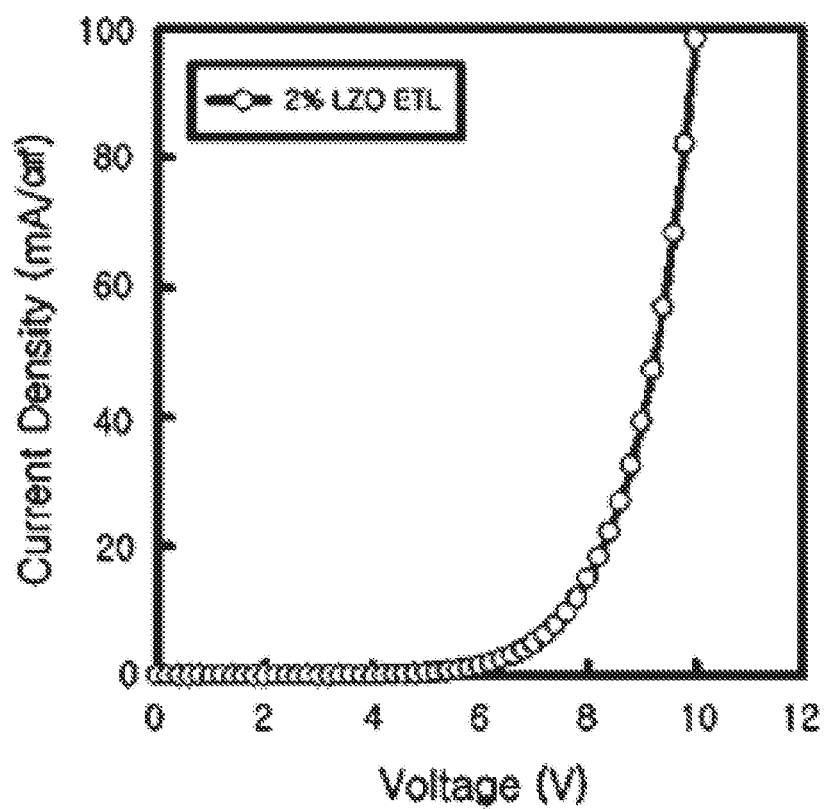
FIG. 9A to FIG. 9D represent the properties of a QLED that uses 2 atomic % LZO based on a solution process as the charge transport layer.
Figure 9B:
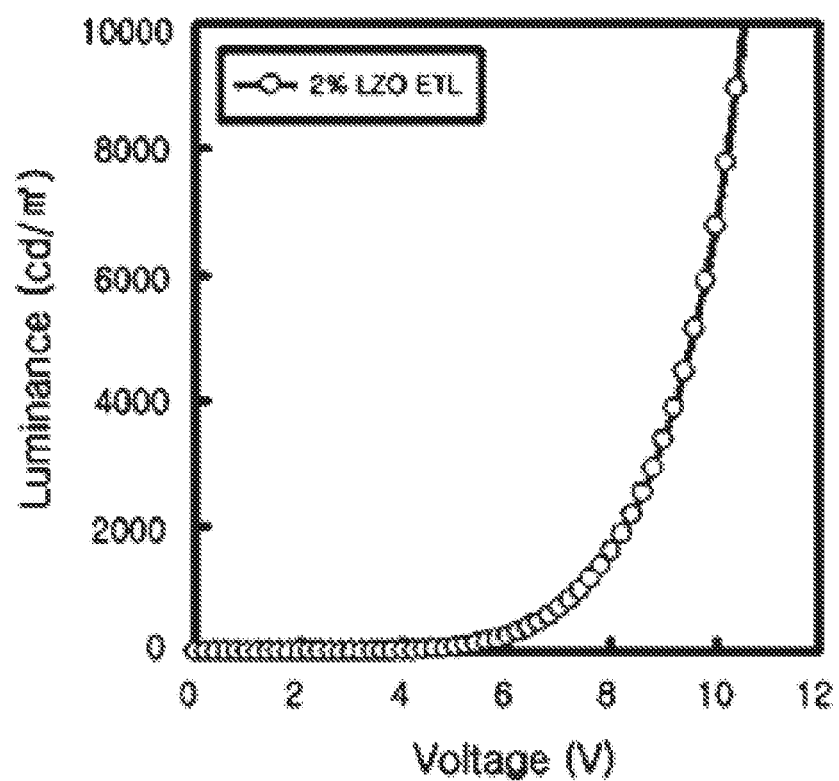
Figure 9C:
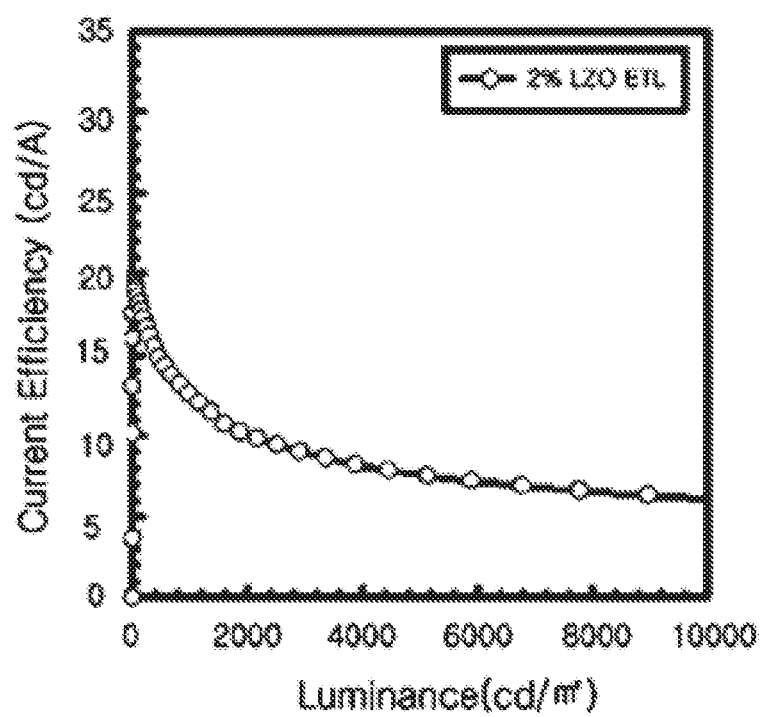
Figure 9D:
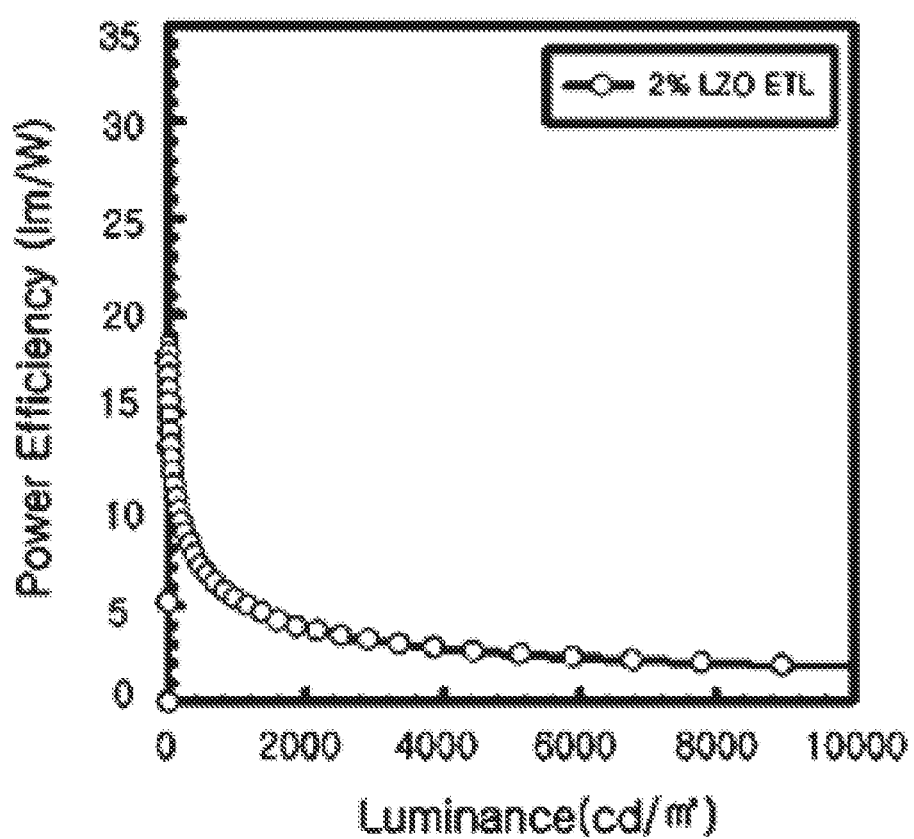
Figure 10A:
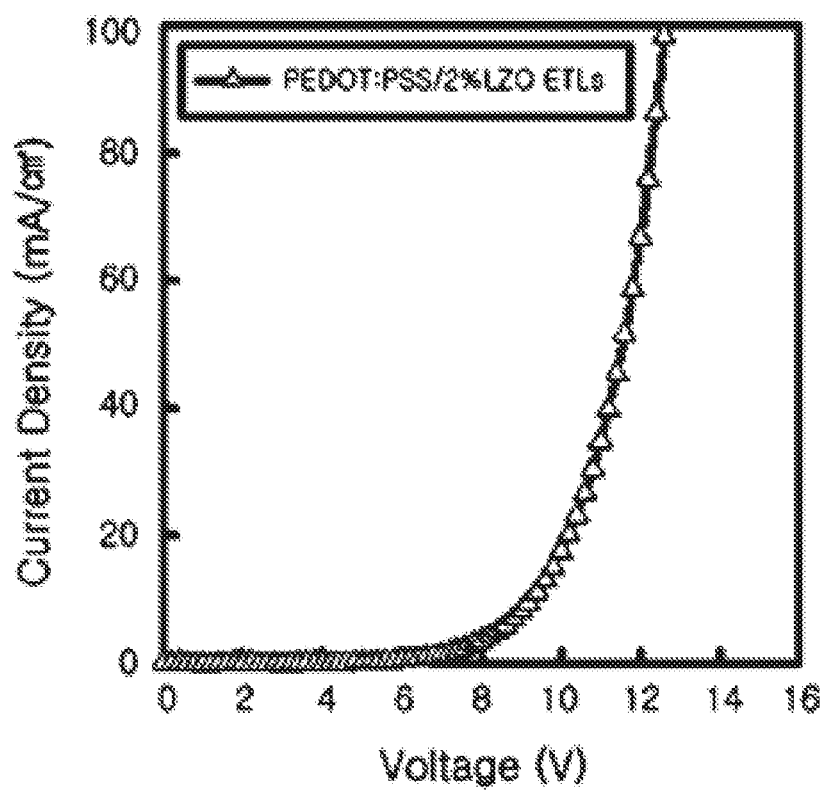
FIG. 10A to FIG. 10D represent the properties of a QLED that uses PEDOT:PSS/2 atomic % LZO based on a solution process according to an embodiment of the present invention as the charge-generating layer.
Figure 10B:
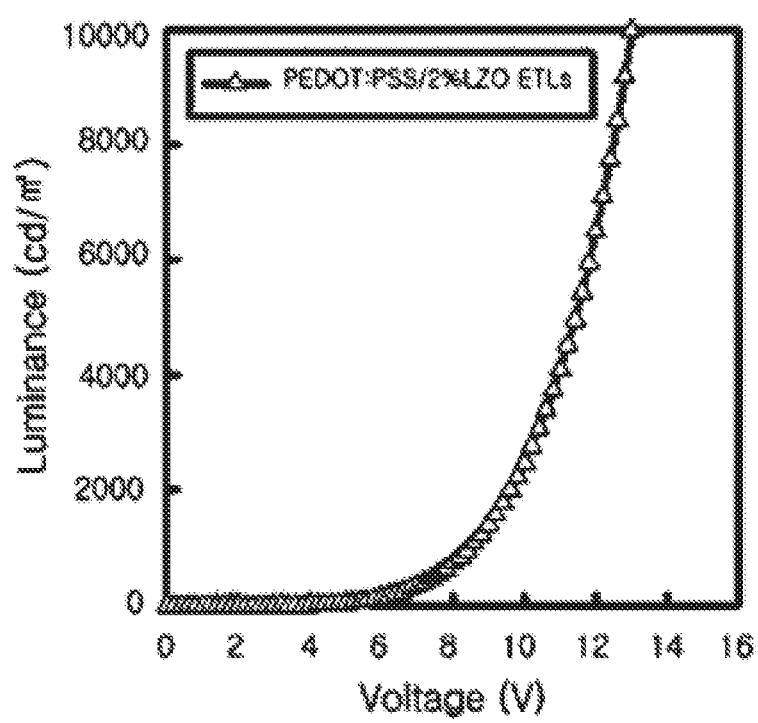
Figure 10C:
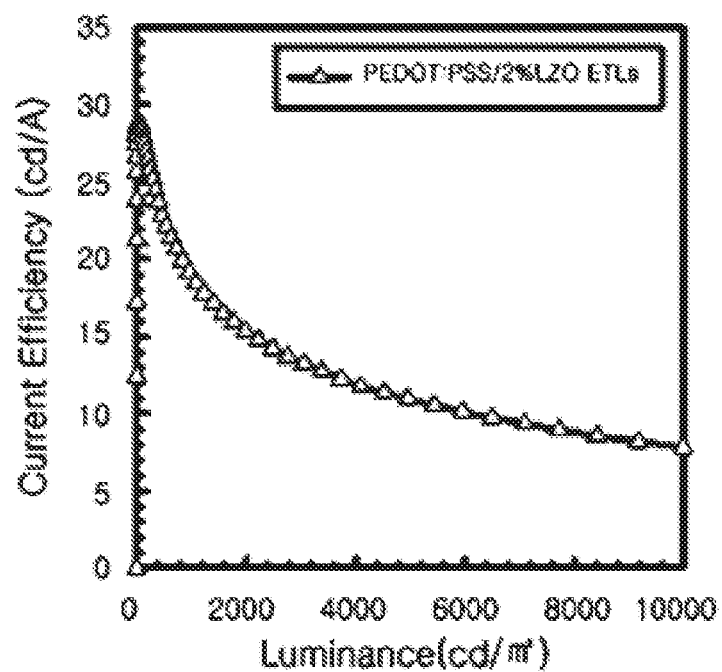
Figure 10D:
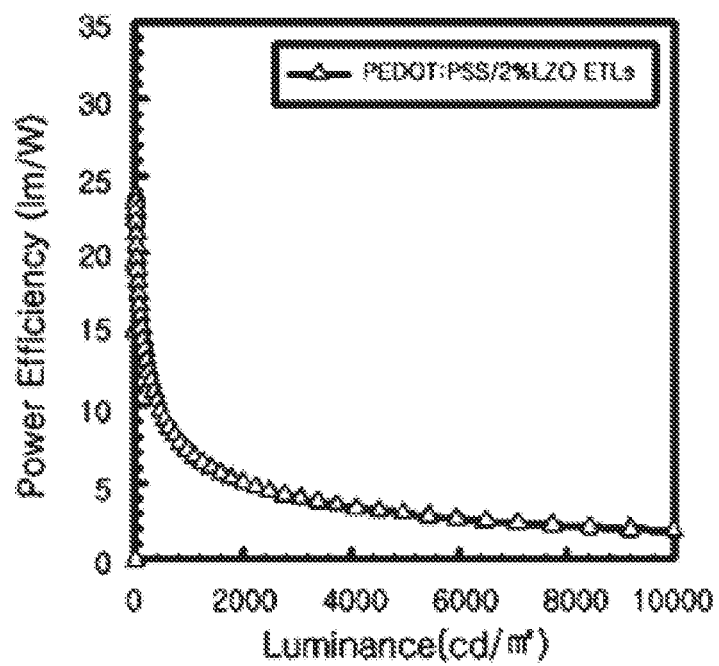

FIG. 8 shows graphs which illustrate that the work function of the substrate remains unaffected when a charge-generating layer according to an embodiment of the present invention is applied.

Referring to FIG. 8, it can be seen that, when a charge-generating layer including LZO/PEDOT:PSS is applied to an OLED according to this embodiment, there are virtually no differences in the properties of the OLED between a substrate having an ITO UV ozone treatment (w/UV treatment, work function 4.7 eV) and a substrate having no ozone treatment (w/o UV treatment, work function 4.2 eV).

This shows that when a charge-generating layer according to this embodiment is used, it can be applied to OLED's that include various substrates without being limited by the work function.

SECOND EXAMPLE

An organic light-emitting diode was prepared with the charge-generating layer formed as a layer-by-layer type with 2 atomic % LZO and PEDOT:PSS.

The LZO having zinc oxide doped with 2 atomic % of Li used ethanol as the solvent, while the PEDOT:PSS used water as the solvent.

The prepared solutions were printed over the cathode by way of a solution process under a nitrogen or air atmosphere.

Afterwards, an electron injection/transport transport layer, a light-emitting layer, a hole injection/transport layer, and an anode were formed sequentially.

In the case of the quantum dot light-emitting diode, quantum dot material of a CdSe/CdS/ZnS (core/shell/shell type) structure was used for the light-emitting layer, 4,4,4-tris(N-carbazolyl)triphenylamine (TCTA), 4,4'-bis[N-(naphthyl)-N-phenylamino]biphenyl (NPB) were used for the hole transport layer, 1,4,5,8,9,11-hexaazatriphenylene-hexacarbonitrile (HAT-CN) was used for the hole injection layer, and aluminum was used for the anode.

FIG. 9A to FIG. 9D represent the properties of a QLED that uses 2 atomic % LZO based on a solution process as the charge transport layer, and FIG. 10A to FIG. 10D represent the properties of a QLED that uses PEDOT:PSS/2 atomic % LZO based on a solution process according to an embodiment of the present invention as the charge-generating layer.

In each of FIG. 9A to FIG. 9D and FIG. 10A to FIG. 10D, graph (a) represents current density-voltage (J-V) characteristics, and graph (b) represents luminance-voltage (L-V) characteristics. Also, graph (c) represents current efficiency-luminance (C/E-L) characteristics, and graph (d) represents power efficiency-luminance (P/E-L) characteristics.

Also, Table 2 below lists the detailed properties of the QLED represented in each of FIG. 9A to FIG. 9D and FIG. 10A to FIG. 10D.

TABLE 2

| HILs | $V_T$ (V) | $V_D$ (V) | Maximum C/E (cd/A) | Maximum P/E (lm/W) | At 1,000 cd/m² C/E (cd/A) | At 1,000 cd/m² P/E (lm/W) | At 10,000 cd/m² C/E (cd/A) | At 10,000 cd/m² P/E (lm/W) |
|---|---|---|---|---|---|---|---|---|
| 2% LZO | 2.4 | 5.2 | 19.7 | 18.4 | 12.5 | 5.3 | 6.1 | 1.8 |
| PEDOT:PSS/ 2% LZO | 2.7 | 5.5 | 28.9 | 54.5 | 16.4 | 6.3 | 8.1 | 2.0 |

Referring to FIG. 9A to FIG. 9D and Table 2, it can be seen that the QLED using solution process-based 2 atomic % LZO as the electron transport layer, i.e. the QLED to which a charge-generating layer according to this embodiment has not been applied, has a current density of 0.37 mA/cm² at around 5 V and a brightness of 1,600 cd/m² at around 8 V. Also, at a brightness of 1,000 cd/m², the current efficiency is 12.5 cd/A, and the power efficiency is 5.3 lm/W.

Referring to FIG. 10A to FIG. 10D and Table 2, it can be seen that the QLED using solution process-based PEDOT:PSS/2 atomic % LZO as the charge-generating layer has a current density of 0.15 mA/cm² at around 5 V and a brightness of 729 cd/m² at around 8 V. Also, at a brightness of 1,000 cd/m², the current efficiency is 16.4 cd/A, and the power efficiency is 6.3 lm/W.

Figure 11:
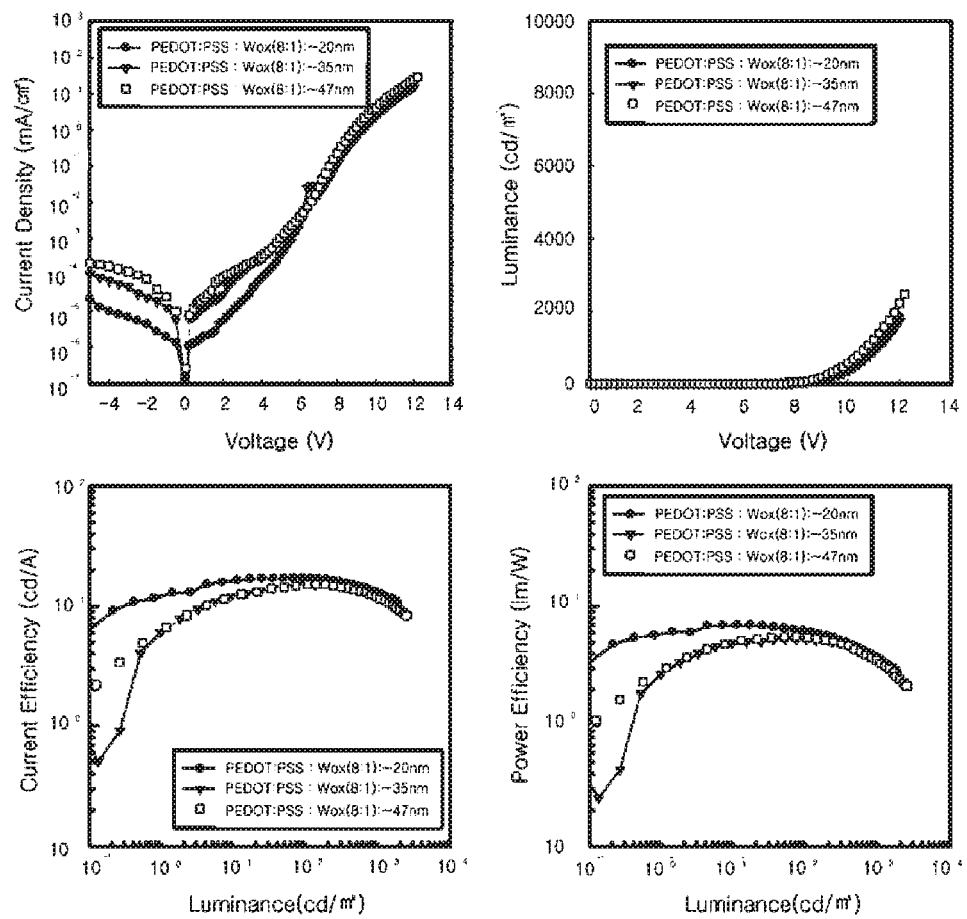
FIG. 11 represents the properties of a QLED according to an embodiment of the present invention for different thicknesses of the p-type layer.

FIG. 11 represents the properties of a QLED according to an embodiment of the present invention for different thicknesses of the p-type layer.

In FIG. 11, the p-type layer for the charge-generating layer according to this embodiment was formed by mixing tungsten oxide into PEDOT:PSS, and it can be observed that from among the different thicknesses, the greatest improvements are obtained in all aspects, such as leakage current, efficiency at low luminance, etc., when the thickness is 20 nm.

Figure 12:
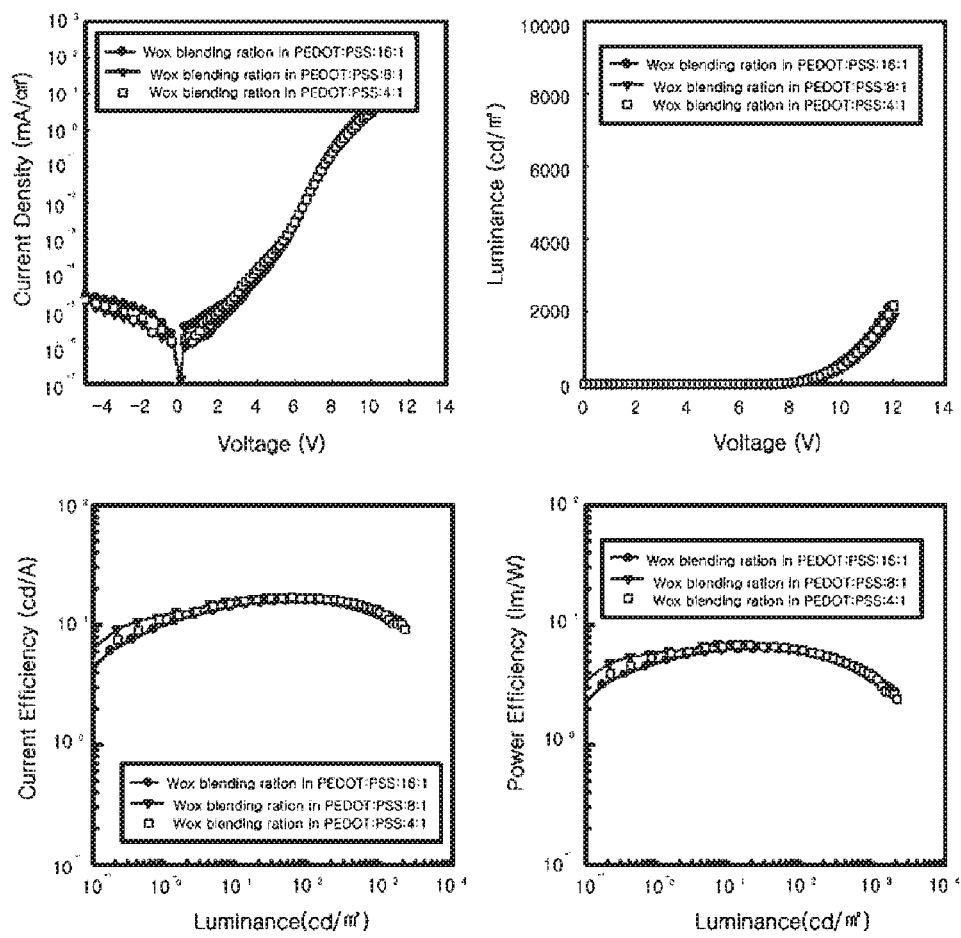
FIG. 12 represents properties obtained for different concentrations of oxides mixed into the p-type layer according to an embodiment of the present invention.

FIG. 12 represents properties obtained for different concentrations of oxides mixed into the p-type layer according to an embodiment of the present invention.

FIG. 12 shows the properties when the p-type layer of the charge-generating layer is formed by mixing PEDOT:PSS and tungsten oxide at volume ratios of 16:1, 8:1, and 4:1.

Referring to FIG. 12, it can be observed that the greatest improvements are obtained when the PEDOT:PSS and tungsten oxide are missed in a ratio of 8:1.

Figure 13:
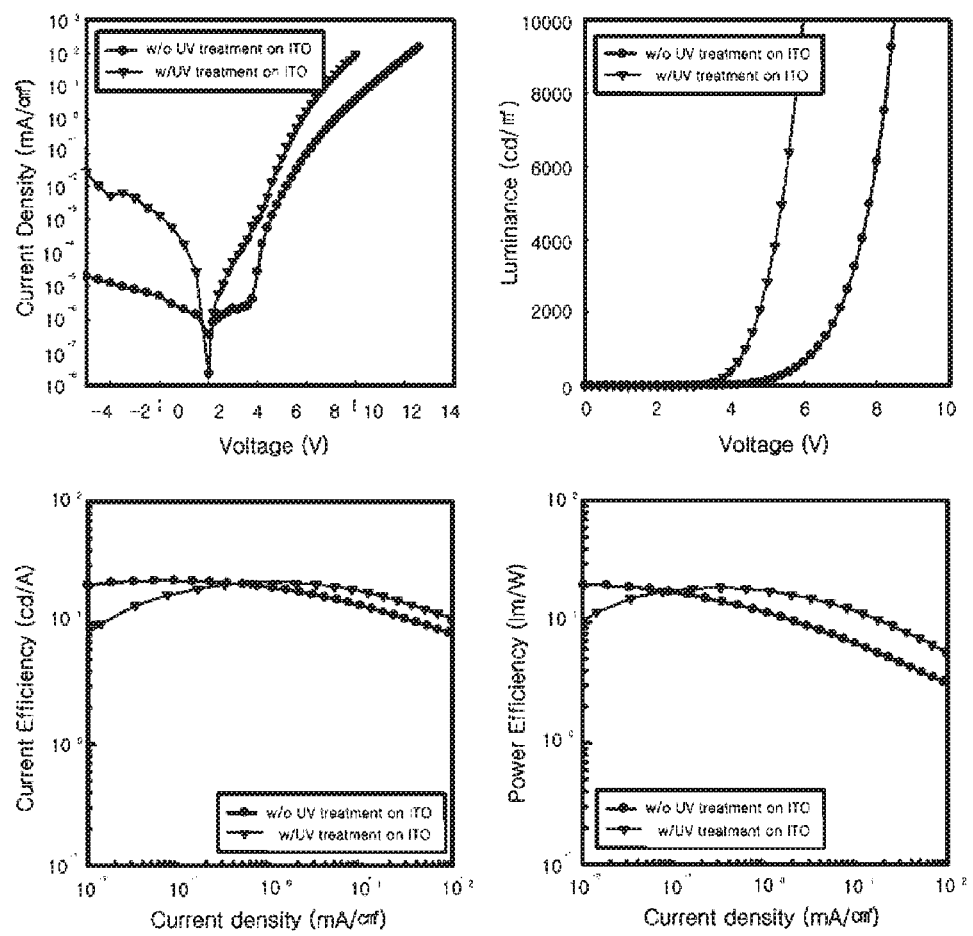
FIG. 13 and FIG. 14 show graphs which illustrate that the work function of the substrate remains unaffected when a charge-generating layer is applied to a QLED according to an embodiment of the present invention.
Figure 14:
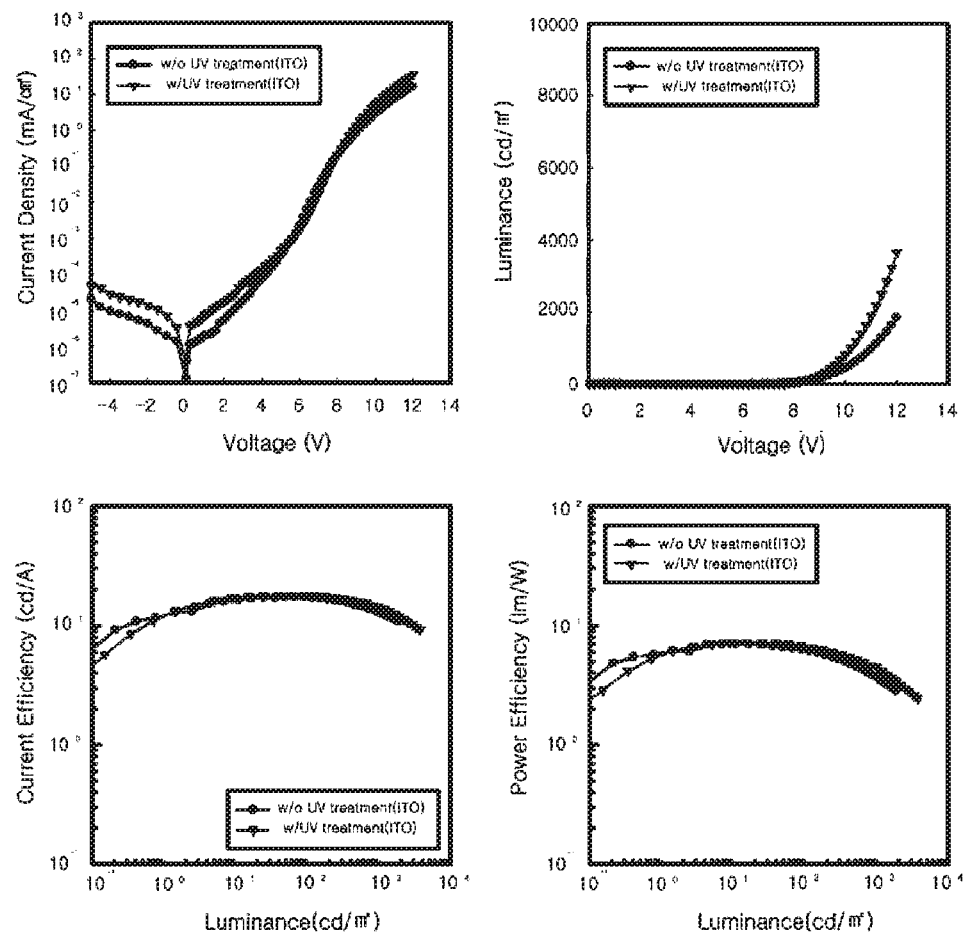

FIG. 13 and FIG. 14 show graphs which illustrate that the work function of the substrate remains unaffected when a charge-generating layer is applied to a QLED according to an embodiment of the present invention.

As illustrated in FIG. 13, with a QLED that does not include a charge-generating layer, the properties of the element may differ greatly according to the work function of the ITO substrate.

However, as illustrated in FIG. 14, with a QLED in which the charge-generating layer is formed by way of a solution process, it can be observed that there are virtually no differences in the properties of the QLED between a substrate having an ITO UV ozone treatment (w/UV treatment, work function 4.7 eV) and a substrate having no ozone treatment (w/o UV treatment, work function 4.2 eV).

This shows that when a charge-generating layer according to this embodiment is used, it can be applied to QLED's that include various substrates without being limited by the work function.

It should be apparent to the skilled person that the present invention described above is not limited by the embodiments described above or by the appended drawings and that various substitutions, additions, and modifications are possible without departing from the technical spirit of the present invention.

What is claimed is:

1. A light-emitting element comprising an anode, a cathode, a light-emitting layer, and a charge-generating layer, wherein the charge-generating layer comprises a p-type layer of an organic semiconductor and an n-type layer of an oxide semiconductor formed by way of a solution process in a layer-by-layer structure, and wherein a thickness ratio between the p-type layer and the n-type layer ranges from 1:0.5 to 1:2.

2. The light-emitting element of claim 1, wherein the organic semiconductor comprises at least one of PEDOT:PSS and a mixture of the PEDOT:PSS and an additive.

3. The light-emitting element of claim 2, wherein the additive comprises at least one of tungsten oxide, graphene oxide (GO), CNBC, molybdenum oxide ($MoO_x$), vanadium oxide ($V_2O_5$), and nickel oxide ($NiO_x$).

4. The light-emitting element of claim 2, wherein the additive is added in a proportion of 5 to 50 volume percent to the PEDOT:PSS.

5. The light-emitting element of claim 1, wherein the oxide semiconductor comprises at least one of zinc oxide (ZnO) or the zinc oxide doped with Al, Li, Cs, Ca, and Mg.

6. The light-emitting element of claim 5, wherein a content of a dopant with which the zinc oxide is doped is 0.1 to 30 atomic percent with respect to the zinc oxide.

7. The light-emitting element of claim 1, wherein the light-emitting layer is an inorganic substance having quantum dots.

* * * * *